United States Patent
Xiong et al.

(10) Patent No.: US 11,699,373 B2
(45) Date of Patent: Jul. 11, 2023

(54) DISPLAY PANEL AND DISPLAY DEVICE WITH REDUCED CHARGE ACCUMULATION IN SEMICONDUCTOR LAYER

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Zhiyong Xiong, Shanghai (CN); Yaolin Wang, Shanghai (CN); Rui Ding, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 140 days.

(21) Appl. No.: 17/193,881

(22) Filed: Mar. 5, 2021

(65) Prior Publication Data
US 2022/0208050 A1    Jun. 30, 2022

(30) Foreign Application Priority Data
Dec. 29, 2020  (CN) .......................... 202011603100.5

(51) Int. Cl.
*G09G 3/20* (2006.01)
*H01L 27/12* (2006.01)
*G09F 9/30* (2006.01)

(52) U.S. Cl.
CPC .............. *G09G 3/20* (2013.01); *G09F 9/301* (2013.01); *G09G 2300/0426* (2013.01);
(Continued)

(58) Field of Classification Search
CPC ............ G09G 3/20; G09G 2300/0426; G09G 2330/028; G09F 9/301; H01L 27/1218; H01L 27/124
See application file for complete search history.

(56) References Cited

U.S. PATENT DOCUMENTS

2002/0047839 A1* 4/2002 Kasai ................... G09G 3/3233
345/211
2004/0095168 A1* 5/2004 Miyazawa ............. G09G 3/325
327/108
(Continued)

FOREIGN PATENT DOCUMENTS

CN        104575395 A       4/2015
CN        107393905 A       11/2017
(Continued)

*Primary Examiner* — Adam J Snyder
(74) *Attorney, Agent, or Firm* — Anova Law Group, PLLC

(57) ABSTRACT

A display panel and a display device are provided in the present disclosure. The display panel, having a display region and a frame region outside the display region, includes a base substrate; a buffer layer on a side of the base substrate, where the buffer layer includes an a-Si layer; a semiconductor layer on a side of the buffer layer away from the base substrate; an insulation layer on a side of the semiconductor layer away from the base substrate; and a power signal layer on a side of the insulation layer away from the base substrate. The power signal layer includes a plurality of first power voltage lines in the display region; and the power signal layer is electrically connected to a power signal terminal which alternately outputs a positive voltage signal and a negative voltage signal.

15 Claims, 12 Drawing Sheets

(52) U.S. Cl.
CPC ...... *G09G 2330/028* (2013.01); *H01L 27/124* (2013.01); *H01L 27/1218* (2013.01)

(56) References Cited

U.S. PATENT DOCUMENTS

| | | | |
|---|---|---|---|
| 2006/0012310 A1* | 1/2006 | Chen | G09G 3/3233 |
| | | | 315/169.3 |
| 2006/0176250 A1* | 8/2006 | Nathan | G09G 3/3258 |
| | | | 345/76 |
| 2008/0001855 A1* | 1/2008 | Hamer | G09G 3/3233 |
| | | | 345/76 |
| 2019/0189723 A1* | 6/2019 | Kim | G09G 3/3266 |
| 2019/0207163 A1* | 7/2019 | Paek | G09G 3/32 |
| 2020/0058728 A1* | 2/2020 | Song | G09G 3/3233 |
| 2020/0212156 A1* | 7/2020 | Gu | G09G 3/20 |

FOREIGN PATENT DOCUMENTS

| | | | | |
|---|---|---|---|---|
| CN | 109713012 A | * | 5/2019 | ............... G09G 3/20 |
| CN | 109713012 A | | 5/2019 | |
| CN | 110047895 A | | 7/2019 | |
| CN | 111092108 A | | 5/2020 | |

* cited by examiner

DISPLAY PANEL AND DISPLAY DEVICE WITH REDUCED CHARGE ACCUMULATION IN SEMICONDUCTOR LAYER

CROSS-REFERENCE TO RELATED APPLICATION

This application claims the priority of Chinese Patent Application No. 202011603100.5, filed on Dec. 29, 2020, the content of which is incorporated herein by reference in its entirety.

TECHNICAL FIELD

The present disclosure generally relates to the field of display technology and, more particularly, relates to a display panel and a display device.

BACKGROUND

Currently, for a flexible display panel, thin-film transistor devices are fabricated on a polyimide (PI) film layer of a flexible substrate to achieve flexible and bendable characteristics. However, since the PI film layer of the flexible substrate contains impurities, it is easy for the impurities to diffuse into the channel of the thin-film transistor, thereby affecting the stability of the thin-film transistor and further affecting the display performance of the flexible display panel. For example, the accumulation of channel impurities may easily cause display screen afterimage problems. In order to eliminate the afterimage problems, one or more a-Si thin-film layers need to be added under the channel layer of the thin-film transistor, which is used to block the impurities from the PI film layer of the flexible substrate from entering the channel of the thin-film transistor, thereby improving the display quality of the flexible display panel.

However, during the handling and turnover process of the flexible display panel preparation, it is extremely easy to form charge accumulation at the a-Si thin film layer. When the flexible display panel is in a touch-and-display state (e.g., an operating state of the display panel), charges are accumulated in the channel of the thin film-transistor under the action of voltage such as PVDD and the like, causing the thin-film transistor to have leakage or characteristic deviation. Since the PVDD line is located in the display region, the charge accumulation effect in the display region is relatively strong, and the charge accumulation effect in the edge region of the display region is weak, which may result in a relatively large difference between the intensities of the charge accumulation effect in the display region and the edge region, thereby causing the appearance of edge bright circles and edge bright lines in the display region.

SUMMARY

One aspect of the present disclosure provides a display panel. The display panel, having a display region and a frame region outside the display region, includes a base substrate; a buffer layer on a side of the base substrate, where the buffer layer includes an a-Si layer; a semiconductor layer on a side of the buffer layer away from the base substrate; an insulation layer on a side of the semiconductor layer away from the base substrate; and a power signal layer on a side of the insulation layer away from the base substrate, where the power signal layer includes a plurality of first power voltage lines in the display region; and the power signal layer is electrically connected to a power signal terminal which alternately outputs a positive voltage signal and a negative voltage signal.

Another aspect of the present disclosure provides a display device, including a display panel. The display panel, having a display region and a frame region outside the display region, includes a base substrate; a buffer layer on a side of the base substrate, where the buffer layer includes an a-Si layer; a semiconductor layer on a side of the buffer layer away from the base substrate; an insulation layer on a side of the semiconductor layer away from the base substrate; and a power signal layer on a side of the insulation layer away from the base substrate, where the power signal layer includes a plurality of first power voltage lines in the display region; and the power signal layer is electrically connected to a power signal terminal which alternately outputs a positive voltage signal and a negative voltage signal.

Other aspects of the present disclosure can be understood by those skilled in the art in light of the description, the claims, and the drawings of the present disclosure.

BRIEF DESCRIPTION OF THE DRAWINGS

In order to more clearly explain embodiments of the present disclosure or the technical solutions in the existing technology, the drawings required for describing the embodiments or the existing technology are briefly introduced hereinafter. Obviously, the drawings in the following description are merely embodiments of the present disclosure. Other drawings may also be obtained by those skilled in the art without any creative work according to provided drawings.

DETAILED DESCRIPTION

The technical solutions in embodiments of the present disclosure are clearly and completely described below in conjunction with the drawings in embodiments of the present disclosure. Obviously, the described embodiments are only a part of embodiments of the present disclosure, rather than all of the embodiments. Based on embodiments of the present disclosure, all other embodiments obtained by those skilled in the art without creative work shall fall within the protection scope of the present disclosure.

As mentioned in the background, during the handling and turnover process of the flexible display panel preparation, it is extremely easy to form charge accumulation at the a-Si thin film layer. When the flexible display panel is in the touch screen state, the charges are accumulated in the channel of the thin film-transistor under the action of voltage such as PVDD and the like, causing the thin-film transistor to have leakage or characteristic deviation. Since the PVDD line is located in the display region, the charge accumulation effect in the display region is relatively strong, and the charge accumulation effect in the edge region of the display region is weak, which may result in a relatively large difference between the intensities of the charge accumulation effect in the display region and the edge region, thereby causing the appearance of edge bright circles and edge bright lines in the display region.

Embodiments of the present disclosure provide a display panel and a display device, which may effectively solve the technical problems in the existing technology, improve the appearance of the edge bright circles and edge bright lines in the display region of the display panel, and ensure the display effect of the display device to be high.

In order to achieve the above-mentioned objectives, the technical solutions provided by embodiments of the present disclosure are described as follows. The technical solutions provided by embodiments of the present disclosure are described in detail with reference to FIGS. 1-14.

Figure 1:
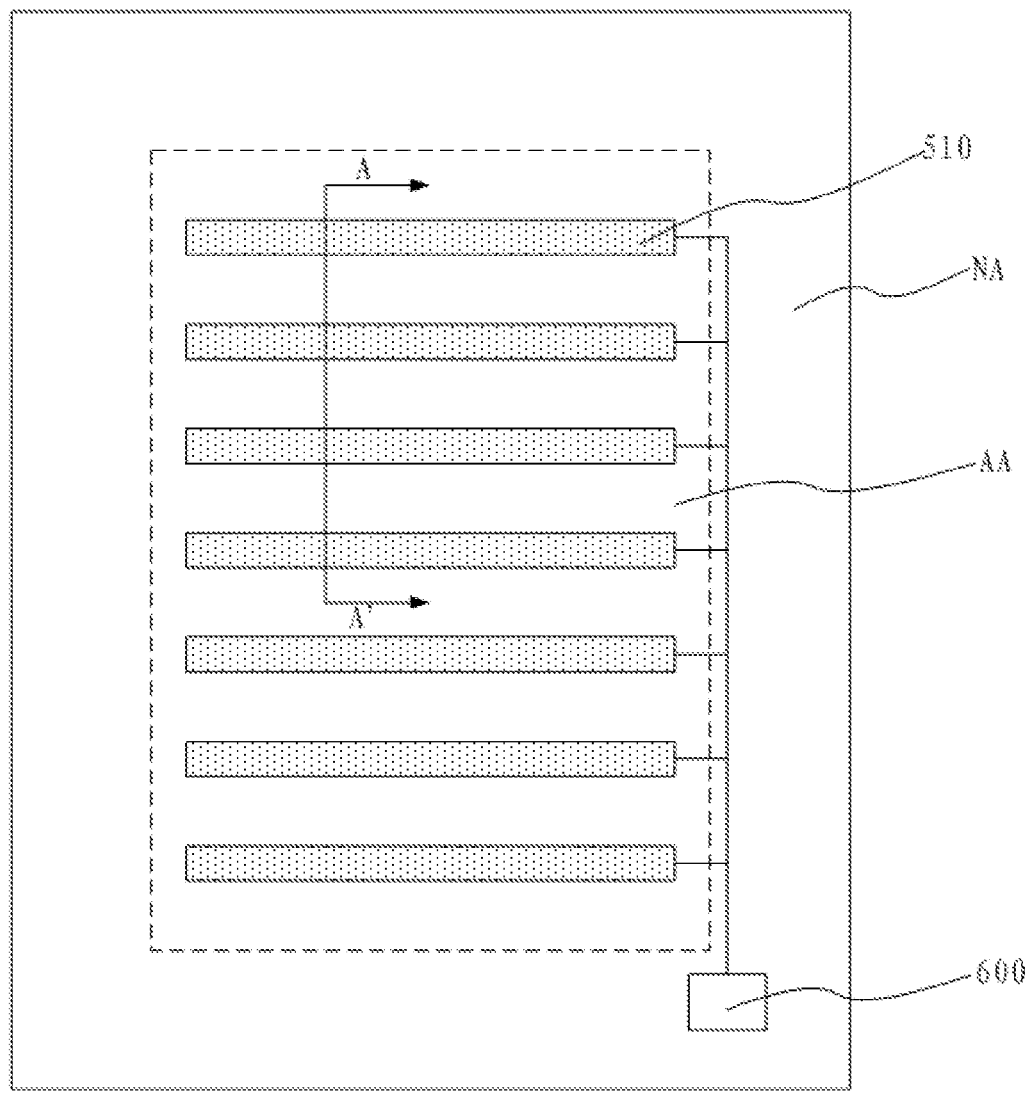
FIG. 1 illustrates a structural schematic of a display panel according to various embodiments of the present disclosure.
Figure 2:
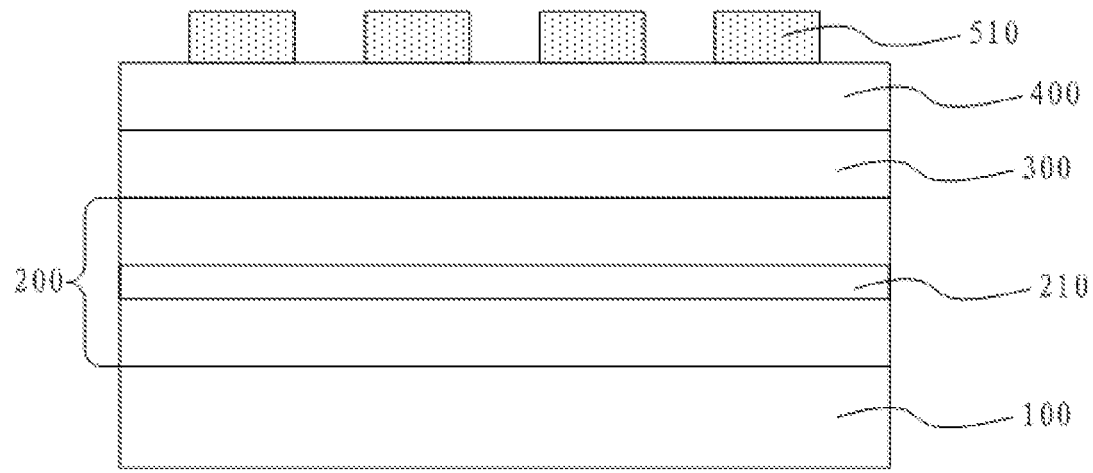
FIG. 2 illustrates a cross-sectional view along an AA' direction in FIG. 1.

Referring to FIGS. 1-2, FIG. 1 illustrates a structural schematic of a display panel according to various embodiments of the present disclosure; and FIG. 2 illustrates a cross-sectional view along an AA' direction in FIG. 1. The display panel provided by embodiments of the present disclosure may include a display region AA and a frame region NA located outside the display region AA. The display panel may include:

a base substrate 100;

a buffer layer 200 on a side of the base substrate 100, where the buffer layer 200 may include an a-Si layer 210;

a semiconductor layer 300 on a side of the buffer layer 200 away from the base substrate 100;

an insulation layer 400 on a side of the semiconductor layer 300 away from the base substrate 100; and a power signal layer on a side of the insulation layer 400 away from the base substrate 100, where the power signal layer may include a plurality of first power voltage lines 510 located in the display region; the power signal layer may be electrically connected to a power signal terminal 600; and the power signal terminal 600 may alternately output a positive voltage signal and a negative voltage signal.

It should be understood that in the technical solutions provided by embodiments of the present disclosure, the power signal terminal electrically connected to the power signal layer may alternately output the positive voltage signal and the negative voltage signal; when the power signal terminal outputs the positive voltage signal, the first power voltage line may be connected to the positive voltage signal to cooperatively drive the display panel to display normally, and at this point, the charges of the a-Si layer may accumulate toward the semiconductor layer; then when the power signal terminal outputs the negative voltage signal, the charges accumulated in the semiconductor layer may dissipate. Therefore, the charge accumulation effect of the semiconductor layer in the display region may be reduced, and the appearance of the edge bright circles and edge bright lines in the display region of the display panel may be improved, thereby ensuring the desirable display effect of the display device.

It should be noted that the display panel provided by embodiments of the present disclosure may further include a gate electrode metal layer on the side of the insulation layer away from the base substrate, an interlayer insulation layer on the side of the gate electrode metal layer away from the base substrate, a source and drain metal layer on the side of the interlayer insulation layer away from the base substrate, a passivation layer on the side of the source and drain metal layer away from the base substrate, an anode layer on the side of the passivation layer away from the base substrate, a pixel definition layer located on the side of the anode layer away from the base substrate, a light-emitting layer which is located at an opening of the pixel definition layer and corresponds to the anode of the anode layer, a cathode layer on the side of the light-emitting layer away from the base substrate, and an encapsulation layer on the side of the cathode layer away from the base substrate, which is the existing technology, thereby not being described in detail in the present disclosure.

The power signal layer provided by embodiments of the present disclosure may be disposed at a same layer as the gate electrode metal layer or the source and drain metal layer, or the power signal layer may be an independent film structure, which may not be limited according to various embodiments of the present disclosure. The display region of the display panel provided by embodiments of the present disclosure may include a plurality of sub-pixels, and each sub-pixel may include a pixel circuit. The power signal layer may be used to provide the positive voltage signal to the pixel circuit connected to the power signal layer through the first power voltage line when the display panel normally displays pictures, thereby cooperating with the pixel circuit to drive the light-emitting device to emit light. In addition, when the first power voltage line is connected to the negative voltage signal outputted from the power signal terminal, the charges accumulated in the semiconductor layer may be dissipated, such that the charge accumulation effect of the semiconductor layer in the display region may be reduced, which may result in a relatively small difference between the charge accumulation of the semiconductor layer in the display region and the charge accumulation of the semiconductor layer at the edge of the display region, thereby improving the appearance of the edge bright circles and edge bright lines in the display region of the display panel.

In one embodiment of the present disclosure, the plurality of first power voltage lines provided by the present disclosure may be arranged sequentially along one direction or in a mesh arrangement, and the like, which may not be limited according to various embodiments of the present disclosure.

In one embodiment of the present disclosure, a time length of a single output of the negative voltage signal from the power signal terminal provided by embodiments of the present disclosure may be less than or equal to 1 ms and greater than zero. Furthermore, on the basis of ensuring that the first power voltage line provides the negative voltage signal for the display panel to improve the display effect, the time length of the negative voltage signal may be reduced, which may avoid that human eyes feel the abnormality of the display screen through the visual persistence effect, thereby ensuring that the display panel observed by human eyes displays pictures normally.

A time length of a single output of the positive voltage signal and the negative voltage signal together by the power signal terminal provided by embodiments of the present disclosure may be at least the time length of ¼ picture frame of the display panel. For example, the time length of the single output of the positive voltage signal and the negative voltage signal together by the power signal terminal provided by embodiments of the present disclosure may be the time length of ¼ picture frame, the time length of ½ picture frame, the time length of one picture frame, or two picture frames, which may not be limited according to various embodiments of the present disclosure and may need to be designed differently according to actual applications. For example, when the image refresh frequency of the display panel provided by embodiments of the present disclosure is 60 Hz, the time length of one picture frame of the display panel is 16.67 ms. The time length of the single output of the positive voltage signal and the negative voltage signal together by the power signal terminal may be the time length of ¼ picture frame which is 4.1675 ms, the time length of ½ picture frame which is 8.335 ms, the time length of one picture frame which is 16.67 ms, or two picture frames which is 33.34 ms. Based on the above description, the time length of the single output of the negative voltage signal from the power signal terminal provided by embodiments of the present disclosure may be less than or equal to 1 ms and greater than zero; and the time length of the single output of the positive voltage signal and the negative voltage signal together by the power signal terminal may refer to that the single output of the negative voltage signal is after the single output of the positive voltage signal, and the sum of the time length of the single output of the positive voltage signal and the time length of the single output of the negative voltage signal may be the time length of the single output of the positive voltage signal and the negative voltage signal together by the power signal terminal.

Furthermore, the absolute voltage value of the negative voltage signal provided by embodiments of the present disclosure may be greater than the absolute voltage value of the positive voltage signal. For example, in embodiments of the present disclosure, the voltage value of the provided positive voltage signal may be about 4.6V, and the voltage value of the provided negative voltage signal may be about −6V. Moreover, by setting the absolute voltage value of the negative voltage signal to be greater than the absolute voltage value of the positive voltage signal, when the negative voltage signal is connected to the first power voltage line, the dissipating efficiency of the charges accumulated in the semiconductor layer in the display region may be improved, thereby further improving the display effect of the display device.

Figure 3:
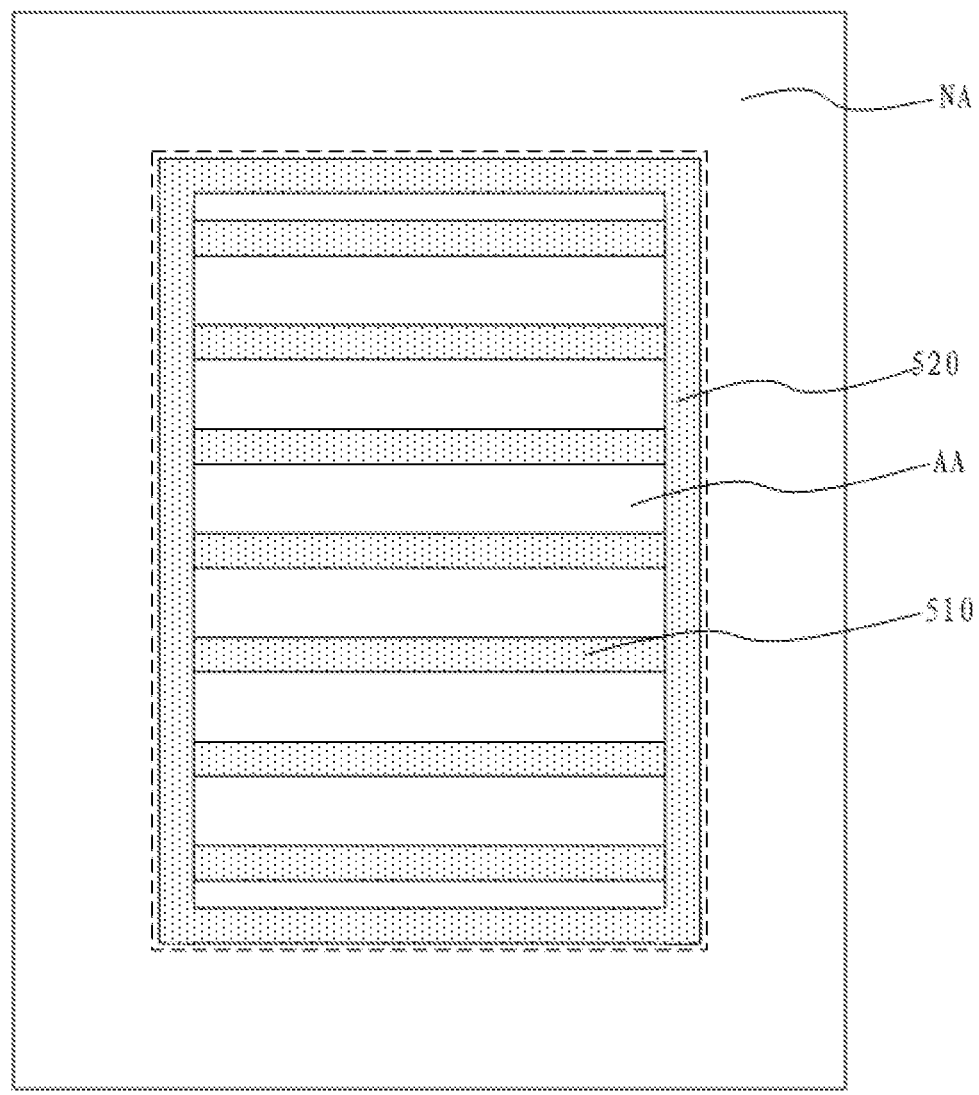
FIG. 3 illustrates a structural schematic of another display panel according to various embodiments of the present disclosure.

Referring to FIG. 3, FIG. 3 illustrates a structural schematic of another display panel according to various embodiments of the present disclosure. The display panel provided by embodiments of the present disclosure may further include a second power voltage line 520 located in the display region AA and surrounding the plurality of first power voltage lines 510; and the second power voltage line 520 may be electrically connected to the power signal terminal (not shown in FIG. 3).

It may be understood that the second power voltage line provided by embodiments of the present disclosure may be arranged by surrounding the plurality of first power voltage lines, such that the second power voltage line may be located at the edge of the display region and may extend along and surround the edge line of the display region. Furthermore, by disposing the second power voltage line at the edge of the display region and connecting the second power voltage line to the positive voltage signal and the negative voltage signal outputted by the power signal terminal, the effect of charge accumulation and dissipation at the semiconductor layer corresponding to the inside of the display region and the edge may remain basically same, thereby ensuring the display brightness uniformity of the entire display region to be high, and improving the display effect of the display device. Optionally, the second power voltage line and the first power voltage line provided in embodiments of the present disclosure may be arranged in a same layer. As shown in FIG. 3, the second power voltage line 520 provided by embodiments of the present disclosure may be electrically connected to the first power voltage line 510, thereby reducing the line impedance of the power signal layer and improving the signal transmission effect of the power signal layer.

Figure 4:
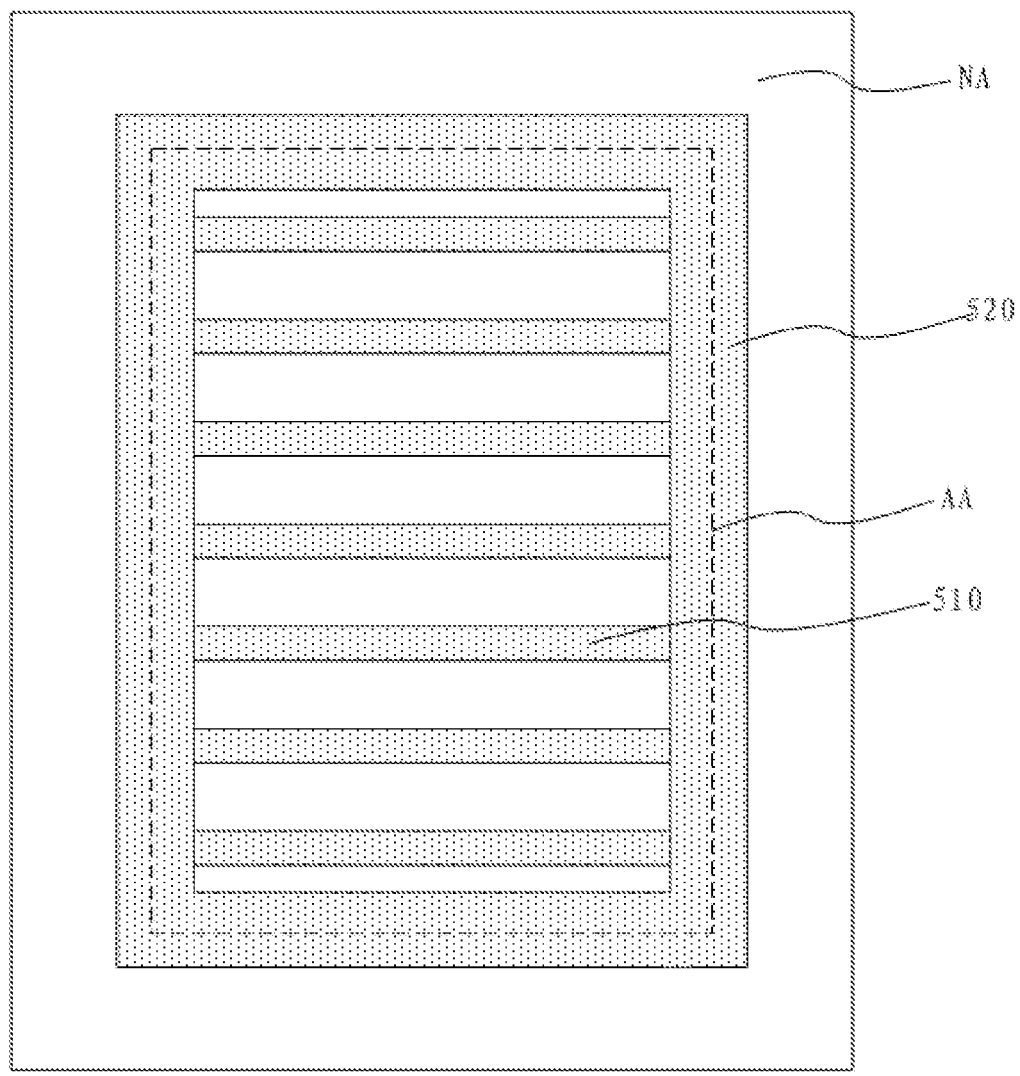
FIG. 4 illustrates a structural schematic of another display panel according to various embodiments of the present disclosure.

Referring to FIG. 4, FIG. 4 illustrates a structural schematic of another display panel according to various embodiments of the present disclosure. The coverage region of the second power voltage line 520 provided by embodiments of the present disclosure may further include a portion extending from the display region AA to the frame region NA.

It may be understood that the coverage region of the second power voltage line may extend from the display region to the frame region in embodiments of the present disclosure, such that the second power voltage line may completely cover the edge of the display region, which may further improve the appearance of the edge bright circles and edge bright lines in the display region of the display panel, thereby ensuring the desirable display effect of the display device.

Figure 5:
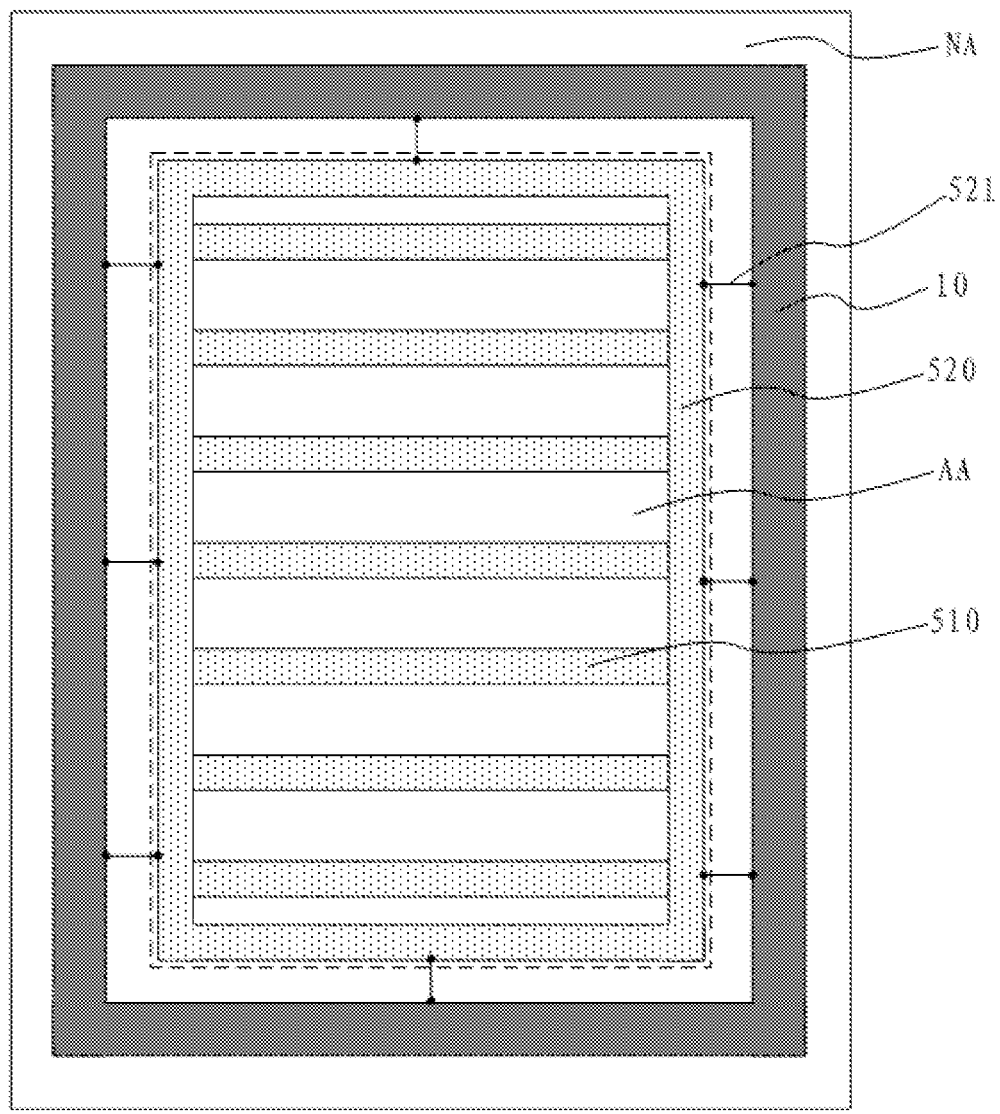
FIG. 5 illustrates a structural schematic of another display panel according to various embodiments of the present disclosure.

Referring to FIG. 5, FIG. 5 illustrates a structural schematic of another display panel according to various embodiments of the present disclosure. The frame region NA provided by embodiments of the present disclosure may include an encapsulation metal padding layer 10 configured to surround the display region AA, and the second power voltage line 520 may be electrically connected to the encapsulation metal padding layer 10.

It may be understood that the second power voltage line provided by embodiments of the present disclosure may be also electrically connected to the encapsulation metal padding layer, which is equivalent to expanding the area of the second power voltage line. In such way, the impedance of the second power voltage line may be reduced, and the charge accumulation effect within the display region and the edge region of the display region may be balanced, which may reduce the intensity difference of the charge accumulation effect within the display region and the edge region, improve the ability of the second power voltage line to affect the charges on the semiconductor layer, and ensure that when the first power voltage line and the second power voltage line are connected to the negative voltage signal, the charge dissipation effect at the corresponding positions of the semiconductor layer may be high, thereby further improving the display effect of the display device.

As shown in FIG. 5, the encapsulation metal padding layer 10 and the second power voltage line 520 provided by embodiments of the present disclosure may be electrically connected through a plurality of connecting lines 521. The encapsulation metal padding layer provided by embodiments of the present disclosure may be disposed at a same layer as the second power voltage line; furthermore, the encapsulation metal padding layer and the second power voltage line may be electrically connected with each other directly through the connecting lines at the same layer. In addition, the encapsulation metal padding layer may also be disposed at a same layer as the second power voltage line and directly connected to the second power voltage line. Or the encapsulation metal padding layer provided by embodiments of the present disclosure may be disposed at a different layer from the second power voltage line; furthermore, the electrical connection between the encapsulation metal padding layer and the second power voltage line may be implemented through the combination of via holes and the connecting lines.

Figure 6:
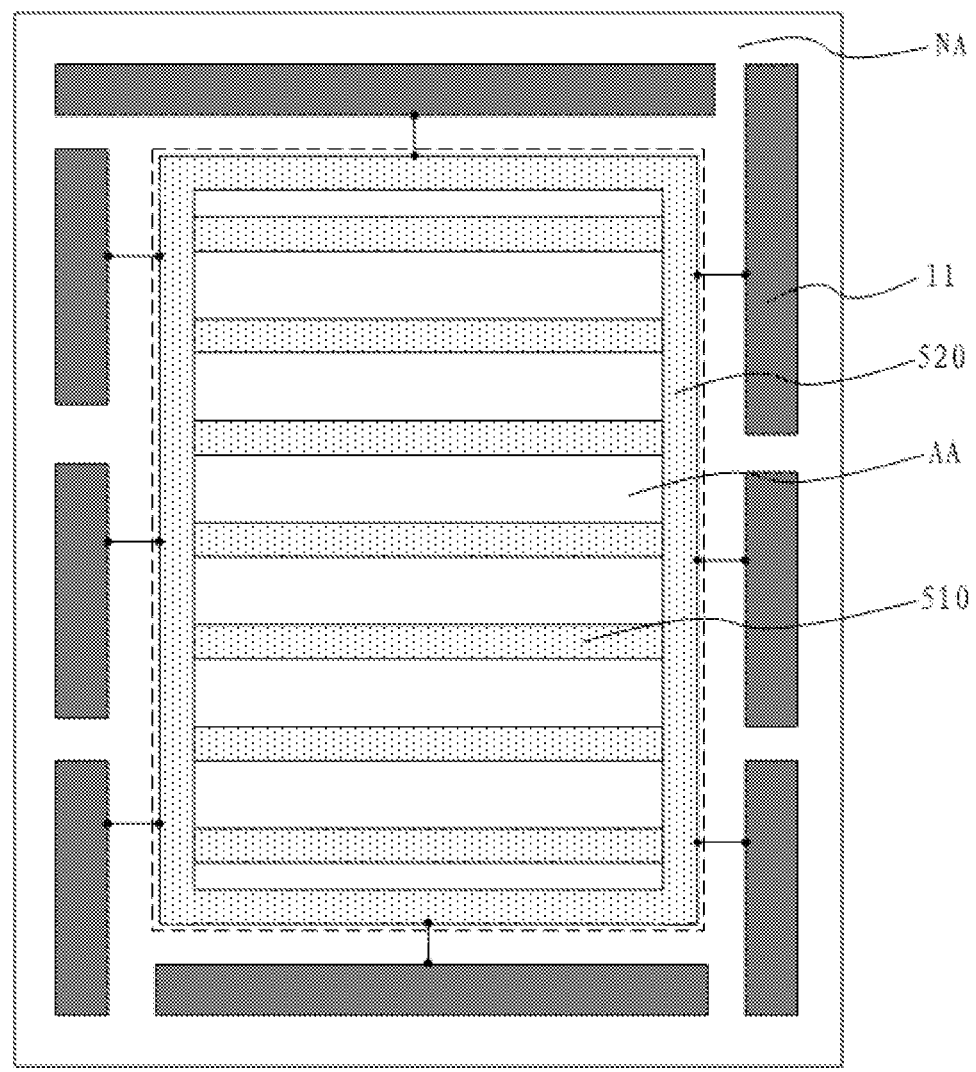
FIG. 6 illustrates a structural schematic of another display panel according to various embodiments of the present disclosure.

Optionally, the encapsulation metal padding layer 10 provided by embodiments of the present disclosure may be a closed loop structure, as shown in FIG. 5. Or, as shown in FIG. 6, the encapsulation metal padding layer provided by embodiments of the present disclosure may include a plurality of encapsulation metal padding blocks 11 along the direction surrounding the display region AA, and different encapsulation metal padding blocks 11 may be separated from each other, which may not be limited according to various embodiments of the present disclosure.

Figure 7:
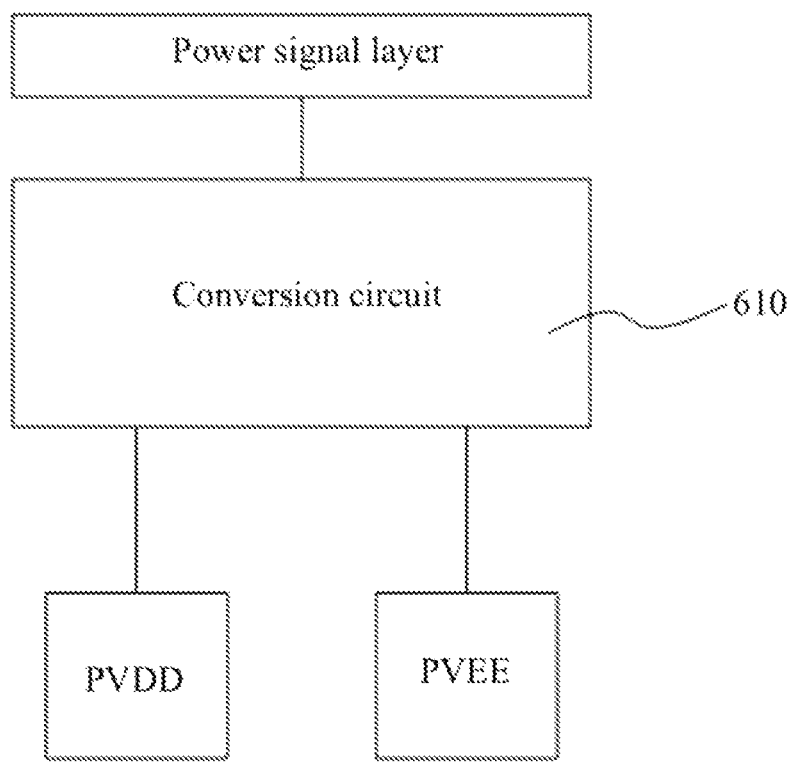
FIG. 7 illustrates a structural schematic of a power signal terminal according to various embodiments of the present disclosure.

Referring to FIG. 7, FIG. 7 illustrates a structural schematic of a power signal terminal according to various embodiments of the present disclosure. The power signal terminal provided by embodiments of the present disclosure may include a first power supply line PVDD, a second power supply line PVEE, and a conversion circuit 610 electrically connected to the first power supply line PVDD and the second power supply line PVEE. The first power supply line PVDD may transmit the positive voltage signal, and the second power supply line PVEE may transmit the negative voltage signal. The other end of the conversion circuit 610 may be electrically connected to the power signal layer.

The conversion circuit 610 may control the first power supply line PVDD to be electrically connected to the power signal layer in a first stage and control the second power supply line PVEE to be electrically connected to the power signal layer in a second stage; and the operations of the first stage and the second stage may be alternately performed.

In one embodiment of the present disclosure, the power signal terminal provided by the present disclosure may be integrated in a drive chip of the display panel, which may not be limited according to various embodiments of the present disclosure.

Figure 8:
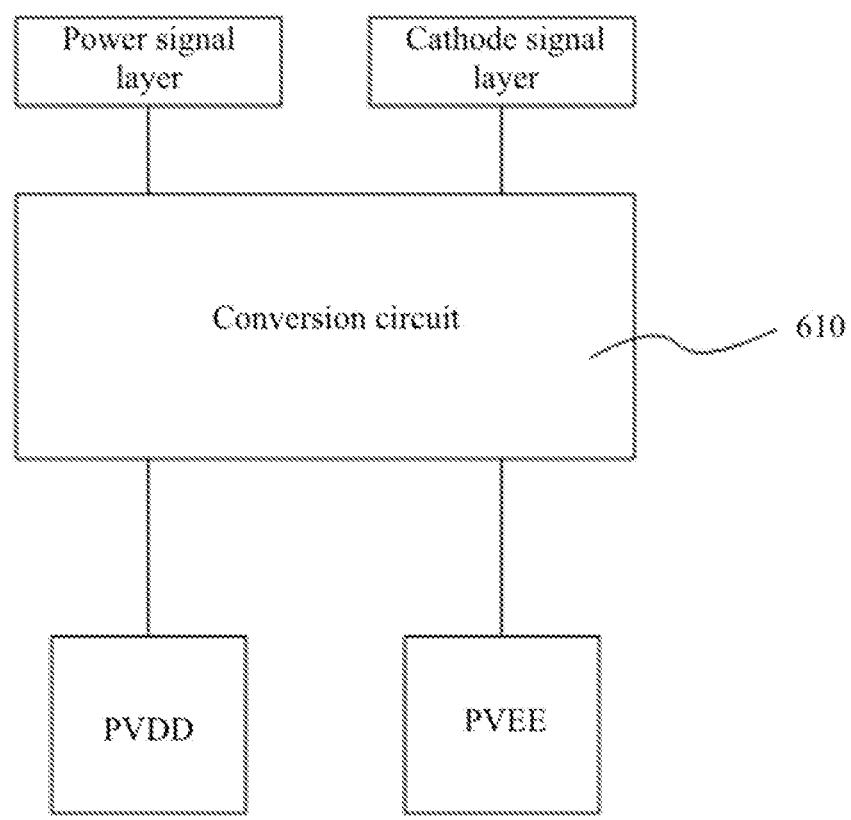
FIG. 8 illustrates a structural schematic of another power signal terminal according to various embodiments of the present disclosure.

Furthermore, the power signal terminal provided in embodiments of the present disclosure may also supply power to a cathode signal layer, where the cathode signal layer may include the cathode layer of the display panel; while ensuring that the power signal terminal supplies power to the power signal layer and the cathode signal layer, the quantity of power terminals may be reduced, and the wiring difficulty may be lowered. As shown in FIG. 8, FIG. 8 illustrates a structural schematic of another power signal terminal according to various embodiments of the present disclosure. The display panel provided by embodiments of the present disclosure may include the cathode signal layer electrically connected to the power signal terminal. One end of the conversion circuit 610 may be electrically connected to each of the first power supply line PVDD and the second power supply line PVEE, and the other end of the conversion circuit 610 may be electrically connected to each of the power signal layer and the cathode signal layer. In the first stage, the conversion circuit 610 may control the first power supply line PVDD to be electrically connected to the power signal layer, and control the second power supply line PVEE to be electrically connected to the cathode signal layer; and in the second stage, the conversion circuit 610 may control the first power supply line PVDD to be electrically connected to the cathode signal layer, and control the second power supply line PVEE to be electrically connected to the power signal layer.

Figure 9:
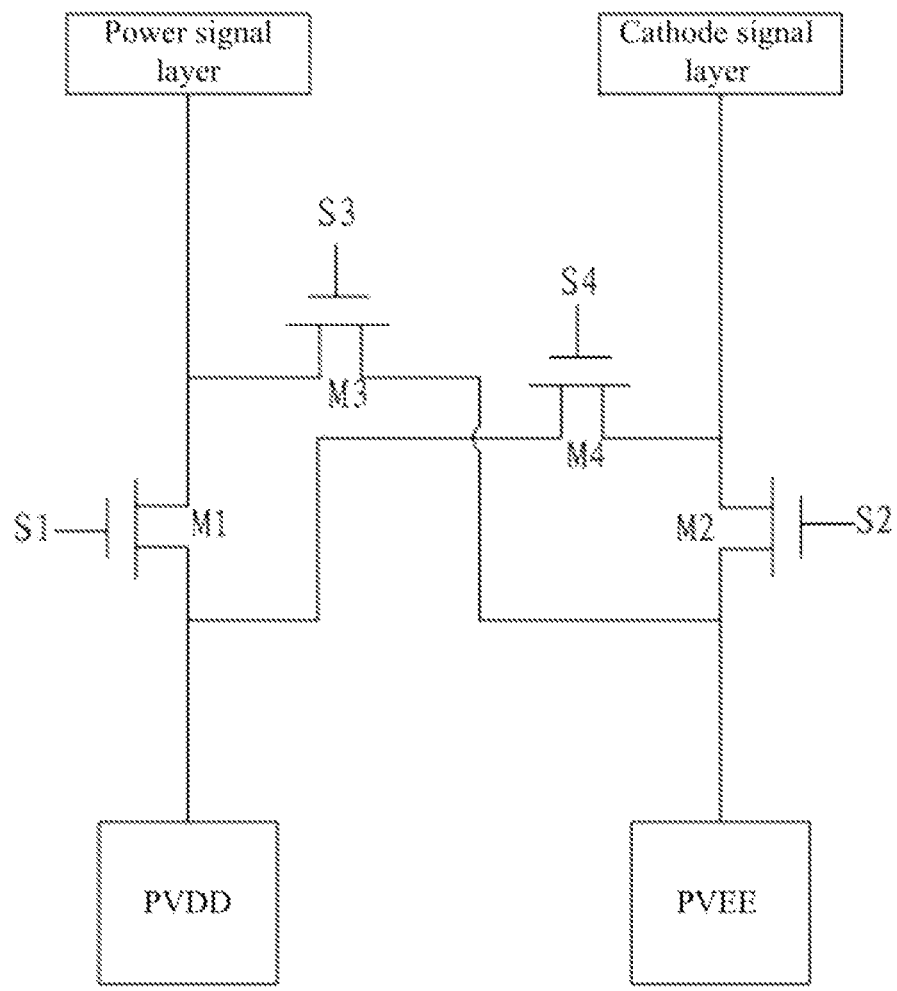
FIG. 9 illustrates a structural schematic of a conversion circuit according to various embodiments of the present disclosure.

Referring to FIG. 9, FIG. 9 illustrates a structural schematic of a conversion circuit according to various embodiments of the present disclosure. The conversion circuit provided by embodiments of the present disclosure may include a first switch transistor M1, a second switch transistor M2, a third switch transistor M3, and a fourth switch transistor M4.

The first terminal of the first switch transistor M1 may be electrically connected to the power signal layer, the second terminal of the first switch transistor M1 may be electrically connected to the first power supply line PVDD, and the control terminal of the first switch transistor M1 may be electrically connected to a first control signal terminal S1.

The first terminal of the second switch transistor M2 may be electrically connected to the cathode signal layer, the second terminal of the second switch transistor M2 may be electrically connected to the second power supply line PVEE, and the control terminal of the second switch transistor M2 may be electrically connected to a second control signal terminal S2.

The first terminal of the third switch transistor M3 may be electrically connected to the power signal layer, the second terminal of the third switch transistor M3 may be electrically connected to the second power supply line PVEE, and the control terminal of the third switch transistor M3 may be electrically connected to a third control signal terminal S3.

The first terminal of the fourth switch transistor M4 may be electrically connected to the cathode signal layer, the second terminal of the fourth switch transistor M4 may be electrically connected to the first power supply line PVDD, and the control terminal of the fourth switch transistor M4 may be electrically connected to a fourth control signal terminal S4.

It should be understood that, for the conversion circuit provided by embodiments of the present disclosure, in the first stage, the first control signal terminal S1 and the second control signal terminal S2 may control the first switch transistor M1 and the second switch transistor M2 to be in conduction, and the third control signal terminal S3 and the fourth control signal terminal S4 may control the third switch transistor M3 and the fourth switch transistor M4 to be in disconnection; at this point, the first switch transistor M1 may electrically connect the first power supply line PVDD with the power signal layer, and the second switch transistor M2 may electrically connect the second power supply line PVEE with the cathode signal layer. Moreover, in the second stage, the first control signal terminal S1 and the second control signal terminal S2 may control the first switch transistor M1 and the second switch transistor M2 to be in disconnection, the third control signal terminal S3 and the fourth control signal terminal S4 may control the third switch transistor M3 and the fourth switch transistor M4 to be in conduction, the third transistor M3 may electrically connect the second power supply line PVEE with the power signal layer, and the fourth transistor M4 may electrically connect the first power supply line PVDD with the cathode signal layer, thereby implementing the alternate control of the first stage and the second stage.

In one embodiment of the present disclosure, the first switch transistor M1 and the second switch transistor M2 may be in conduction or disconnection simultaneously, and the third switch transistor M3 and the fourth switch transistor M4 may be in conduction or disconnection simultaneously. Therefore, the conduction types of the first switch transistor M1 and the second switch transistor M2 provided by the present disclosure may be configured to be same, and the conduction types of the third switch transistor M3 and the fourth switch transistor M4 may be configured to be same. Furthermore, the first control signal terminal S1 and the second control signal terminal S2 provided by embodiments of the present disclosure may be a same control signal terminal; and the third control signal terminal S3 and the fourth control signal terminal S4 provided by embodiments of the present disclosure may be a same control signal terminal, thereby reducing the quantity of control signal terminals. The first switch transistor M1 and the second switch transistor M2 may both be P-type switch transistors or N-type switch transistors; and the third switch transistor M3 and the fourth switch transistor M4 may both be P-type switch transistors or N-type switch transistors.

It should be noted that, in other embodiments of the present disclosure, the conduction types of the first switch transistor M1, the second switch transistor M2, the third switch transistor M3, and the fourth switch transistor M4 may be different from the above-mentioned description, which may not be limited according to various embodiments of the present disclosure and may need to be designed according to actual applications.

Figure 10:
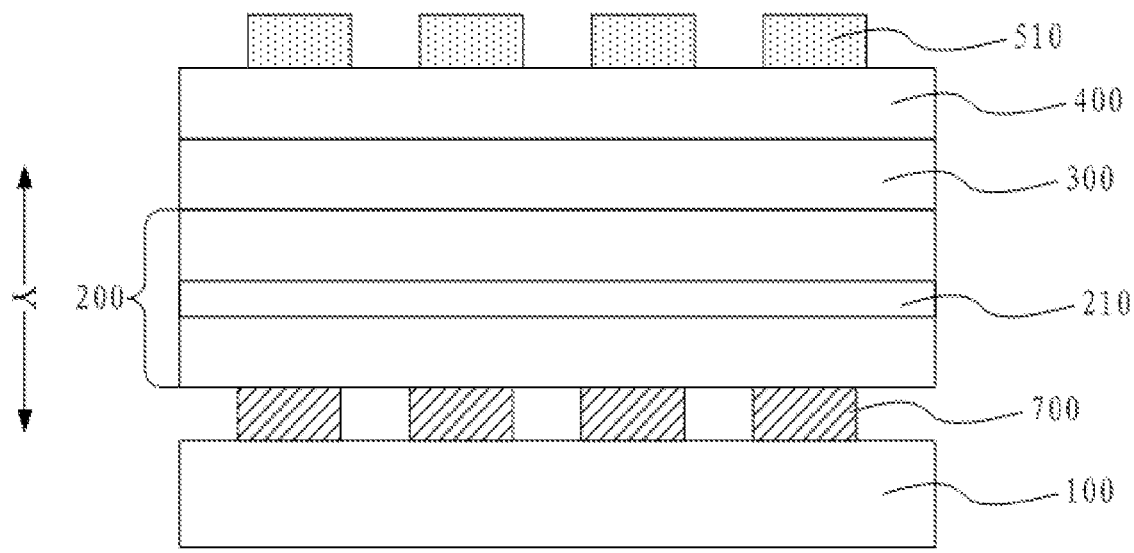
FIG. 10 illustrates a structural schematic of another display panel according to various embodiments of the present disclosure.

In one embodiment of the present disclosure, the migration of charges in the a-Si layer to the semiconductor layer may also be controlled through an electric field in the present disclosure, thereby improving the appearance of the edge bright circles and edge bright lines in the display region of the display panel. Referring to FIG. 10, FIG. 10 illustrates a structural schematic of another display panel according to various embodiments of the present disclosure. The display panel may further include an auxiliary circuit layer. The auxiliary circuit layer may include a plurality of auxiliary electrode lines 700, and the a-Si layer 210 may be located between the auxiliary circuit layer and the power signal layer. The auxiliary electrode lines 700 may overlap the first power voltage lines 510 along a direction Y perpendicular to the plane where the display panel is located, and the auxiliary circuit layer may be connected to a fixed voltage (not shown in FIG. 10).

It may be understood that the auxiliary electrode lines overlap the first power voltage lines provided by embodiments of the present disclosure along the direction perpendicular to the plane where the display panel is located, such that an electric field may be generated in the overlapped region of the auxiliary electrode lines 700 and the first power voltage lines 510, the charges in the a-Si layer 210 may be affected by the electric field to reduce the ability to migrate to the semiconductor layer 300, which may reduce the influence of charges on the semiconductor layer 300 and improve the display effect of the display device. Optionally, the fixed voltage provided in embodiments of the present disclosure may be a negative voltage, and the absolute value of the voltage value of the fixed voltage may be greater than the voltage value of the positive voltage signal. For example, the voltage value of the positive voltage signal provided by embodiments of the present disclosure may be about 4.6V, and the fixed voltage may be about −5V or −6V, thereby ensuring the optimal effect of the electric field.

Or the auxiliary circuit layer provided by embodiments of the present disclosure may also be connected to a same voltage as the power signal layer. That is, the display panel provided by embodiments of the present disclosure may further include an auxiliary circuit layer. The auxiliary circuit layer may include a plurality of auxiliary electrode lines, and the a-Si layer may be located between the auxiliary circuit layer and the power signal layer. The auxiliary electrode lines may overlap the first power voltage lines along the direction perpendicular to the plane where the display panel is located, and the auxiliary circuit layer may be connected to a same voltage as the power signal layer. The voltage connected to the auxiliary circuit layer provided in embodiments of the present disclosure may be provided by an independent voltage terminal, or the auxiliary circuit layer provided in embodiments of the present disclosure may be electrically connected to the power signal layer, thereby reducing the quantity of voltage terminals and decreasing the area occupied by wiring.

In one embodiment of the present disclosure, the quantity of auxiliary electrode lines provided by the present disclosure may be same as the quantity of first power voltage lines, and the auxiliary electrode lines and the first power voltage lines may be in a one-to-one correspondence; in the corresponding auxiliary electrode lines and first power voltage lines, the auxiliary electrode lines and the first power voltage lines may extend along a same direction and be overlapped with each other correspondingly, such that the overlapped region of the auxiliary electrode lines and the first power voltage lines may be increased, and the effect of the electric field generated by the auxiliary electrode lines and the first power voltage lines may be improved.

Figure 11:
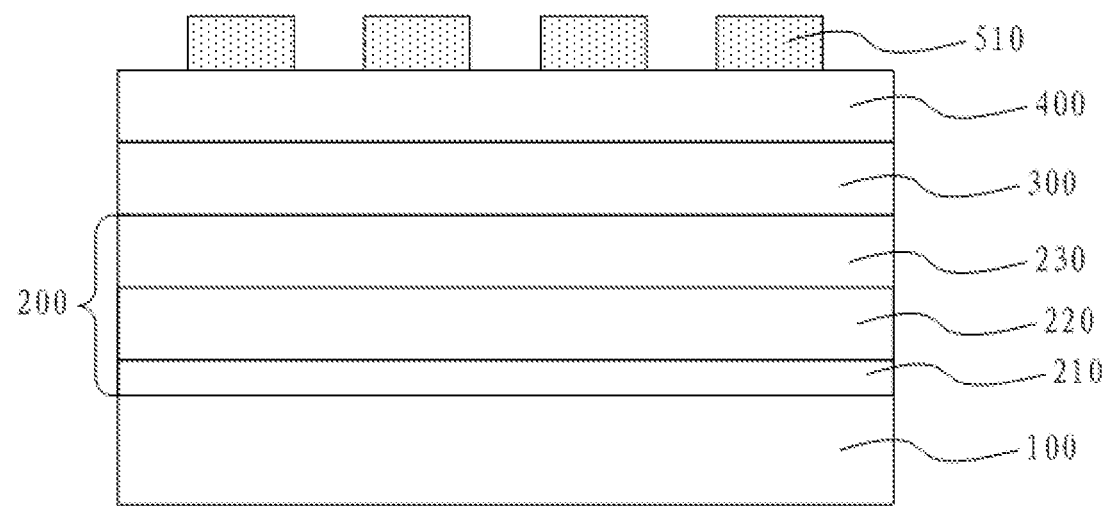
FIG. 11 illustrates a structural schematic of another display panel according to various embodiments of the present disclosure.

As shown in FIG. 11, FIG. 11 illustrates a structural schematic of another display panel according to various embodiments of the present disclosure. The buffer layer 200 provided by embodiments of the present disclosure may include the a-Si layer 210 on the base substrate 100, and also include a silicon oxide layer 220 on the side of the a-Si layer 210 away from the base substrate 100 and a buffer sublayer 230 on the side of the silicon oxide layer 220 away from the base substrate 100, which may not be limited according to various embodiments of the present disclosure.

Optionally, the base substrate provided by the present disclosure may be a PI substrate.

Figure 12:
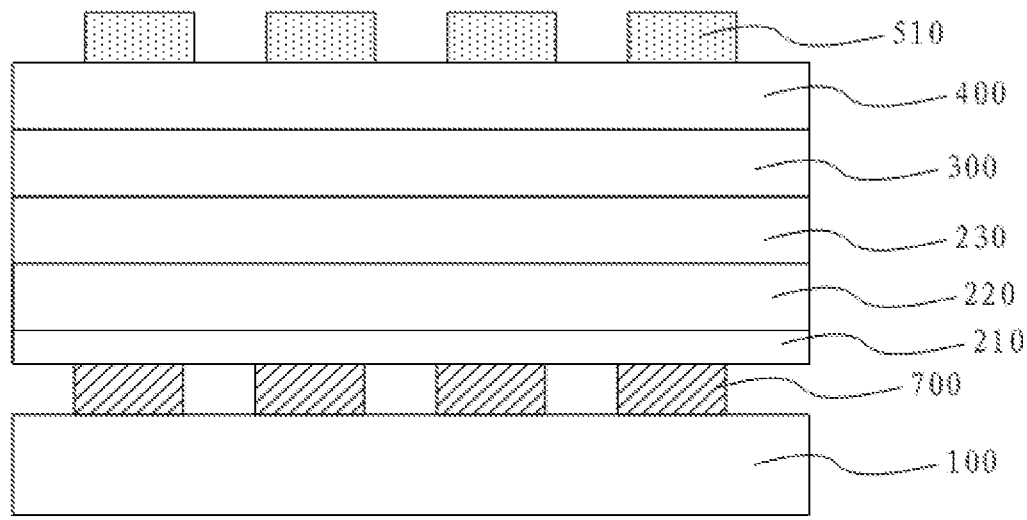
FIG. 12 illustrates a structural schematic of another display panel according to various embodiments of the present disclosure.

As shown in FIG. 12, FIG. 12 illustrates a structural schematic of another display panel according to various embodiments of the present disclosure. On the basis of the display panel shown in FIG. 11, when the display panel provided by embodiments of the present disclosure includes the auxiliary electrode lines 700, the auxiliary electrode lines 700 may be located between the a-Si layer 210 and the base substrate 100.

Figure 13:
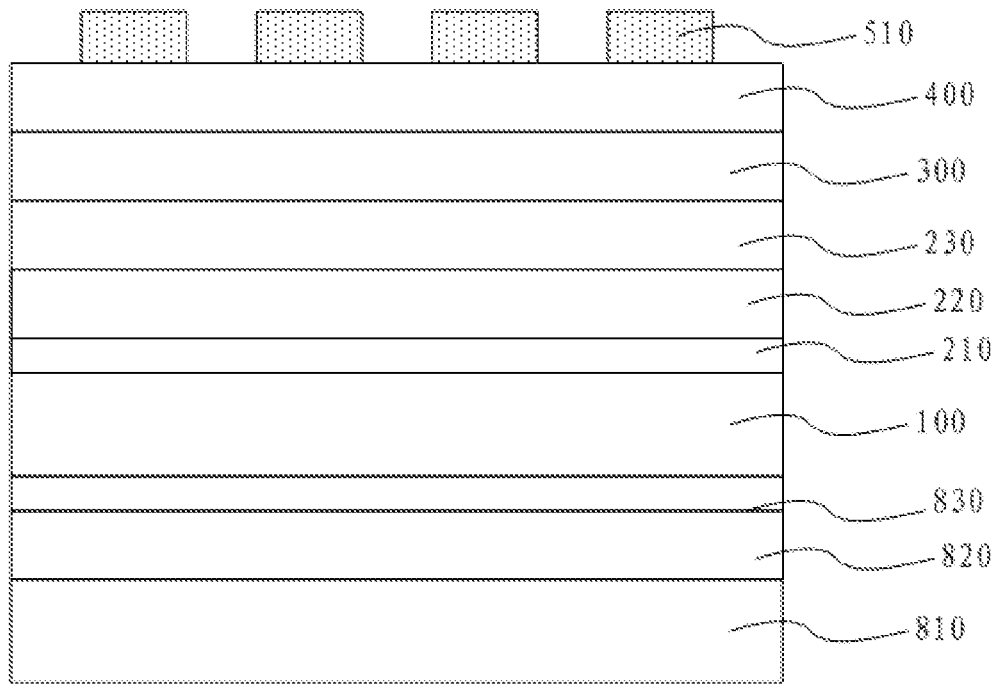
FIG. 13 illustrates a structural schematic of another display panel according to various embodiments of the present disclosure.

In embodiments of the present disclosure, the display panel provided by the present disclosure may also be a multi-substrate display panel. As shown in FIG. 13, FIG. 13 illustrates a structural schematic of another display panel according to various embodiments of the present disclosure. On the basis of the display panel shown in FIG. 11, the display panel may further include:

an auxiliary base substrate 810, where the auxiliary base substrate 810 may be an auxiliary PI substrate;

an auxiliary silicon oxide layer 820 located on the side of the auxiliary base substrate 810; and an auxiliary a-Si layer 830 on the side of the auxiliary silicon oxide layer 820 away from the auxiliary base substrate 810, where the base substrate 100 may be at the side of the auxiliary a-Si layer 830 away from the auxiliary base substrate 810.

Correspondingly, embodiments of the present disclosure also provide a display device, and the display device may include the display panel provided in any one of the above-mentioned embodiments.

Figure 14:
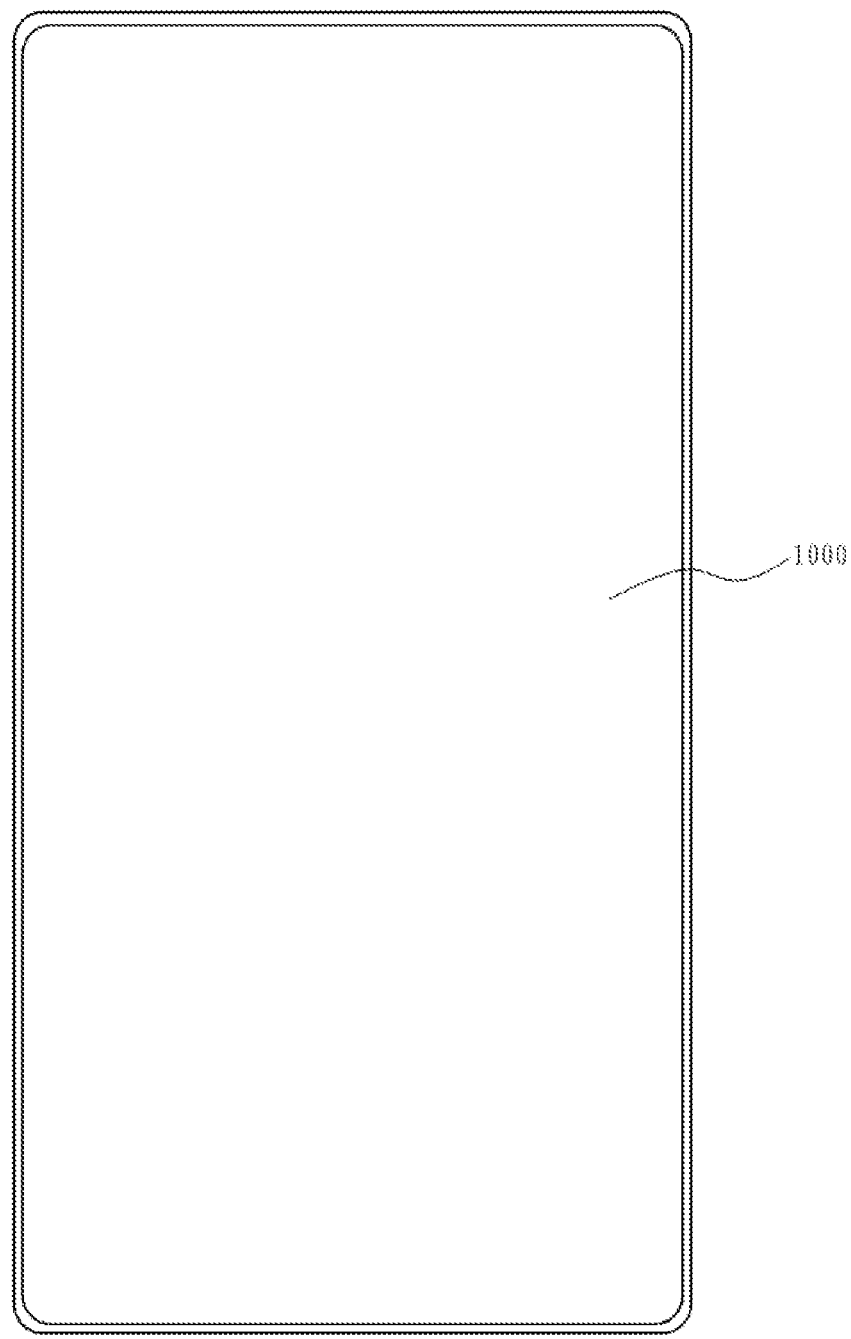
FIG. 14 illustrates a structural schematic of a display device according to various embodiments of the present disclosure.

As shown in FIG. 14, FIG. 14 illustrates a structural schematic of a display device according to various embodiments of the present disclosure. A display device 1000 provided in embodiments of the present disclosure may be a mobile terminal.

It should be noted that the display device provided in embodiments of the present disclosure may also be a product or component with a display function such as a notebook, a tablet computer, a computer, a wearable device, and the like, which may not be limited according to various embodiments of the present disclosure.

From the above-mentioned embodiments, it can be seen that the display panel and the display device provided by the present disclosure may achieve at least the following beneficial effects.

Embodiments of the present disclosure provide the display panel and the display device. The display panel may include the display region and the frame region located outside the display region. The display panel may include the base substrate; the buffer layer on the side of the base substrate, where the buffer layer may include the a-Si layer; the semiconductor layer on the side of the buffer layer away from the base substrate; the insulation layer on the side of the semiconductor layer away from the base substrate; and the power signal layer on the side of the insulation layer away from the base substrate, where the power signal layer may include the plurality of first power voltage lines located in the display region; the power signal layer may be electrically connected to the power signal terminal; and the power signal terminal may alternately output the positive voltage signal and the negative voltage signal.

In the technical solutions provided by embodiments of the present disclosure, the power signal terminal electrically connected to the power signal layer may alternately output the positive voltage signal and the negative voltage signal; when the power signal terminal outputs the positive voltage signal, the first power voltage line may be connected to the positive voltage signal to cooperatively drive the display panel to display normally, and at this point, the charges of the a-Si layer may accumulate toward the semiconductor layer; then when the power signal terminal outputs the negative voltage signal, the charges accumulated in the semiconductor layer may dissipate. Therefore, the charge accumulation effect of the semiconductor layer in the display region may be reduced, and the appearance of the edge bright circles and edge bright lines in the display region of the display panel may be improved, thereby ensuring the desirable display effect of the display device.

The above-mentioned description of embodiments of the present disclosure may enable those skilled in the art to implement or use the present disclosure. Various modifications to such embodiments may be obvious to those skilled in the art, and the general principles defined in the present disclosure may be implemented in other embodiments without departing from the spirit or scope of the present disclosure. Therefore, the present disclosure may not be limited to the embodiments shown in the present disclosure but should conform to the widest scope consistent with the principles and novel features disclosed in the present disclosure.

What is claimed is:

1. A display panel, having a display region and a frame region outside the display region, the display panel comprising:
   a base substrate;
   a buffer layer on a side of the base substrate, wherein the buffer layer includes an a-Si layer;
   a semiconductor layer on a side of the buffer layer away from the base substrate;
   an insulation layer on a side of the semiconductor layer away from the base substrate; and
   a power signal layer on a side of the insulation layer away from the base substrate, wherein the power signal layer includes a plurality of first power voltage lines in the display region; and the power signal layer is electrically connected to a power signal terminal which alternately outputs a positive voltage signal and a negative voltage signal,
   wherein the outputted positive voltage signal drives charges of the buffer layer to accumulate towards the semiconductor layer and the outputted negative voltage signal dissipates the charges accumulated in the semiconductor layer, and a time length of a single output of the negative voltage signal from the power signal terminal is less than or equal to 1 ms and greater than zero.

2. The display panel according to claim 1, wherein:
   an absolute voltage value of the negative voltage signal is greater than an absolute voltage value of the positive voltage signal.

3. The display panel according to claim 1, wherein:
   a time length of a single output of the positive voltage signal and the negative voltage signal together by the power signal terminal is at least a time length of ¼ picture frame of the display panel.

4. The display panel according to claim 1, further including:
   a second power voltage line in the display region and surrounding the plurality of first power voltage lines, wherein the second power voltage line is electrically connected to the power signal terminal.

5. The display panel according to claim 4, wherein:
   the second power voltage line also extends from the display region to the frame region.

6. The display panel according to claim 4, wherein:
   the frame region includes an encapsulation metal padding layer configured to surround the display region, and the second power voltage line is electrically connected to the encapsulation metal padding layer.

7. The display panel according to claim 1, wherein:
   the power signal terminal includes a first power supply line, a second power supply line, and a conversion circuit electrically connected to each of the first power supply line and the second power supply line; the first power supply line transmits the positive voltage signal, and the second power supply line transmits the negative voltage signal; and
   the conversion circuit controls the first power supply line to be electrically connected to the power signal layer in a first stage and control the second power supply line to be electrically connected to the power signal layer in a second stage; and operations in the first stage and the second stage are alternately performed.

8. The display panel according to claim 7, further including:
- a cathode signal layer, electrically connected to the power signal terminal, wherein:
  - in the first stage, the conversion circuit controls the first power supply line to be electrically connected to the power signal layer and controls the second power supply line to be electrically connected to the cathode signal layer; and in the second stage, the conversion circuit controls the first power supply line to be electrically connected to the cathode signal layer and controls the second power supply line to be electrically connected to the power signal layer.

9. The display panel according to claim 8, wherein:
- the conversion circuit includes a first switch transistor, a second switch transistor, a third switch transistor, and a fourth switch transistor;
- a first terminal of the first switch transistor is electrically connected to the power signal layer, a second terminal of the first switch transistor is electrically connected to the first power supply line, and a control terminal of the first switch transistor is electrically connected to a first control signal terminal;
- a first terminal of the second switch transistor is electrically connected to the cathode signal layer, a second terminal of the second switch transistor is electrically connected to the second power supply line, and a control terminal of the second switch transistor is electrically connected to a second control signal terminal;
- a first terminal of the third switch transistor is electrically connected to the power signal layer, a second terminal of the third switch transistor is electrically connected to the second power supply line, and a control terminal of the third switch transistor is electrically connected to a third control signal terminal; and
- a first terminal of the fourth switch transistor is electrically connected to the cathode signal layer, a second terminal of the fourth switch transistor is electrically connected to the first power supply line, and a control terminal of the fourth switch transistor is electrically connected to a fourth control signal terminal.

10. The display panel according to claim 9, wherein:
- conduction types of the first switch transistor and the second switch transistor are same, and conduction types of the third switch transistor and the fourth switch transistor are same.

11. The display panel according to claim 10, wherein:
- the first control signal terminal and the second control signal terminal are a same control signal terminal, and the third control signal terminal and the fourth control signal terminal are a same control signal terminal.

12. The display panel according to claim 1, further including:
- an auxiliary circuit layer, wherein:
  - the auxiliary circuit layer includes a plurality of auxiliary electrode lines; the a-Si layer is between the auxiliary circuit layer and the power signal layer; the plurality of auxiliary electrode lines overlaps the plurality of first power voltage lines along a direction perpendicular to a plane of the display panel; and the auxiliary circuit layer is connected to a fixed voltage.

13. The display panel according to claim 1, further including:
- an auxiliary circuit layer, wherein:
  - the auxiliary circuit layer includes a plurality of auxiliary electrode lines; the a-Si layer is between the auxiliary circuit layer and the power signal layer; the plurality of auxiliary electrode lines overlaps the plurality of first power voltage lines along a direction perpendicular to a plane of the display panel; and a voltage introduced to the auxiliary circuit layer is same as a voltage of the power signal layer.

14. The display panel according to claim 13, wherein:
- the auxiliary circuit layer is electrically connected to the power signal layer.

15. A display device, comprising:
- a display panel, having a display region and a frame region outside the display region, the display panel comprising:
  - a base substrate;
  - a buffer layer on a side of the base substrate, wherein the buffer layer includes an a-Si layer;
  - a semiconductor layer on a side of the buffer layer away from the base substrate;
  - an insulation layer on a side of the semiconductor layer away from the base substrate; and
  - a power signal layer on a side of the insulation layer away from the base substrate, wherein the power signal layer includes a plurality of first power voltage lines in the display region; and the power signal layer is electrically connected to a power signal terminal which alternately outputs a positive voltage signal and a negative voltage signal,
  - wherein the outputted positive voltage signal drives charges of the buffer layer to accumulate towards the semiconductor layer and the outputted negative voltage signal dissipates the charges accumulated in the semiconductor layer, and an absolute voltage of the negative voltage signal is greater than an absolute voltage of the positive voltage signal.

* * * * *